United States Patent [19]

Landesman

[11] Patent Number: 5,008,892
[45] Date of Patent: Apr. 16, 1991

[54] SEMICONDUCTOR LASER DIODES

[75] Inventor: Barbara T. Landesman, Placitas, N. Mex.

[73] Assignee: Talandic Research Corporation, Azusa, Calif.

[21] Appl. No.: 457,251

[22] Filed: Dec. 27, 1989

[51] Int. Cl.⁵ ........................... H01S 3/19; H01S 3/08
[52] U.S. Cl. ........................................ 372/45; 372/49; 372/99; 372/101; 350/452
[58] Field of Search ..................... 372/45, 49, 101, 99, 372/102, 46; 350/452

[56] References Cited

U.S. PATENT DOCUMENTS 3,735,278  5/1973  Schafer et al. ...................... 372/101

FOREIGN PATENT DOCUMENTS 0185904  9/1985  Japan ................................. 350/452
0277091  9/1988  Japan ................................. 372/101

OTHER PUBLICATIONS

B. T. Landesman & H. H. Barrett, "Gaussian amplitude functions that are exact solutions to the scalar Helmholtz equation", J. Opt. Soc. Am. A, vol. 5, No. 10, Oct. 1988, pp. 1610–1619.

B. Tehan Landesman, "Geometrical Representation of the fundamental mode of a Gaussian beam in oblate spheroidal coordinates", J. Opt. Soc. Am. A, vol. 6, No. 1, Jan. 1989, pp. 5–17.

Primary Examiner—Georgia Epps
Attorney, Agent, or Firm—Norman E. Brunell

[57] ABSTRACT

A semiconductor laser diode in which oblate-spheroidal modes are established to enhance emitted beam characteristics. The laser diode laser cavity ends are configured in the shape of Fresnel lenses.

5 Claims, 1 Drawing Sheet

SEMICONDUCTOR LASER DIODES

BACKGROUND OF THE INVENTION

1. Field of the Invention

This invention relates to semiconductor laser diode design and construction. In particular, this invention relates to design and construction techniques for providing enhanced laser beam characteristics from semiconductor lasers.

2. Description of the Prior Art

The use of conventional semiconductor lasers has been limited by many factors, one of which is the type of beam produced. Although generally similar to the beam from a conventional optical laser, the conventional semiconductor laser beam is anamorphic and astigmatic, that is, the laser beam is nonsymetrical and possesses intermediate foci.

Conventional semiconductor laser design and construction techniques have not been able to reduce or prevent beam anamorphism and astigmatism. Such conventional approaches utilize measurements of emitted beam energy and spot size as criteria for semiconductor laser design. Circularity of the semiconductor laser beam has been achieved only with post diode fixes, such as external optics.

The conventional diode-injection, or gain-guided, laser consists of a tiny chip of semiconductor material, such as gallium arsenide (GaAs) typically between 0.3 and 1 mm long, with even smaller transverse dimensions. The chip is cut from heavily n-doped material after p-type impurities have been diffused into the top of the material. The top layer becomes p-type with a thin, planar p-n junction created a short distance below the top surface. If the electrical contact to the diode is shaped into a narrow strip running the length of the diode, the profile of the injected carriers provides a weak, complex waveguide that confines the light laterally. This mechanism is called gain-guiding. Such gain-guided semiconductor lasers are highly astigmatic and have strong instabilities.

Gain guided techniques have been improved by the introduction of dielectric waveguide structures in the lateral direction. Since the light in these structures is guided by variations in the real refractive index of the various materials, the corresponding devices are known as index-guided lasers. Index-guided lasers support only the fundamental transverse and lateral modes to produce a stable, single-mode beam with significantly reduced astigmatism as compared to gain-guided semiconductor lasers.

These techniques result, however, in semiconductor laser designs which produce only a small fraction of the useful laser energy of which they are capable. Laser beams produced by such design and construction techniques are astigmatic and anamorphic and are therefore limited in useful beam energy.

SUMMARY OF THE INVENTION

The proceding and other shortcomings of the prior art are addressed and overcome by the present invention that provides, in a first aspect, a method of enhancing semiconductor laser diode beam characteristics by forming a waveguide cavity in semiconductor material and establishing oblate-spheroidal lasing modes in the semiconductor waveguide.

In another aspect, the present invention provides a semiconductor laser diode having a semiconductor laser waveguide cavity and means for establishing oblate-spheroidal lasing modes in the waveguide cavity.

These and other features and advantages of this invention will become further apparent from the detailed description that follows which is accompanied by a set of drawing figures. In the figures and description, numerals indicate the various features of the invention, like numerals referring to like features throughout both the drawings and the description.

DETAILED DESCRIPTION OF THE PREFERRED EMBODIMENTS

The techniques described below are useful in the design and construction of semiconductor laser diodes in which the astigmatic foci of conventional semiconductor laser diodes have been moved toward convergence to provide a laser beam with a generally Gaussian energy distribution.

In conventional semiconductor laser diodes, the phase front energy is generally considered to be in the shape of a section of a sphere. In the present invention, the phase front energy in the diode is modeled as distributed in the shape of a section of an oblate ellipsoid to produce a beam which is less anamorphic and less astigmatic than a conventional semiconductor laser diode beam.

In accordance With the oblate ellipsoid model of a semiconductor laser diode, oblate-spheroidal Gaussian modes are established in the semiconductor laser waveguide to enhance emitted laser beam characteristics. In accordance with the present invention oblate-spheroidal modes are established in the wave guide by adjusting the structural geometry of the resonant cavity by manipulating the physical configuration, dopant levels, spatial distribution and/or the effective cavity mirror configurations. Such adjustments to the structural geometry to establish, enhance and reinforce oblate-spheroidal modes serve to minimize energy losses associated with phase fronts in conventional semiconductor lasers and improve emitted beam characteristics.

In the preferred embodiment shown below, the cavity end mirrors of a semiconductor laser diode are configured as Fresnel lens equivalents of mirrors in the shape of a section of an oblate ellipsoid so that oblate-spheroidal Gaussian modes may be established in the semiconductor laser waveguide to enhance emitted laser beam characteristics.

Figure 1:
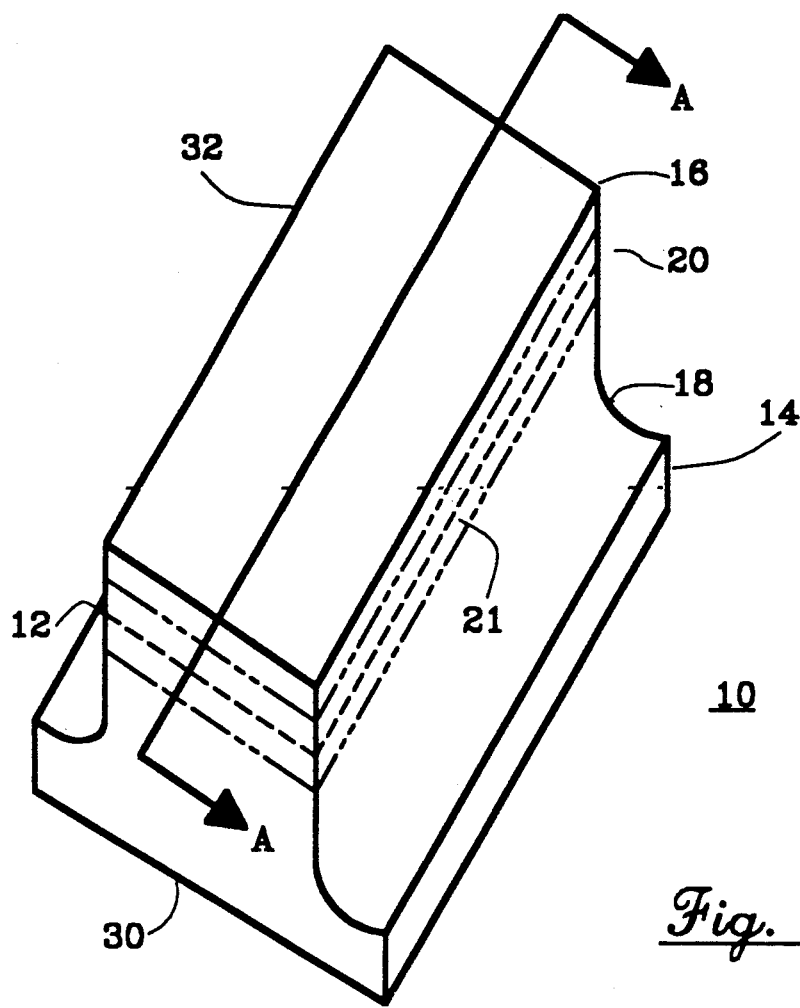
FIG. 1 is a representation of a semiconductor laser constructed according to this invention in which oblate-spheroidal Gaussian modes are established in the semiconductor laser waveguide to enhance emitted laser beam characteristics.

As shown in FIG. 1, semiconductor laser 10 includes p-n unction 12 formed in semiconductor material chip 14 which may, for example, conveniently be formed from a chip 0.3 to 1 mm long of gallium arsenide (GaAs) having an even smaller transverse dimension. Chip material 14 is heavily n-doped material to which p-type impurities have been diffused into one surface to provide p-type layer 16 and n-type layer 18. P-N junction 12 is formed in interface region 20 at the interface between p-type layer 16 and n-type layer 18. The configuration of semiconductor laser 10 is generally that of a p-n diode.

P-type layer 16 and n-type layer is are provided with conventional electrodes and connected with a source of power, not shown. Semiconductor laser 10 emits a coherent beam of radiation when pumped by the application of large forward currents through p-n junction 12. When such large forward currents are passed through semiconductor laser 10, population inversion and lasing action occurs in interface region 20, some portion of which acts as resonant cavity 21.

The emitted radiation is a spontaneous emission, caused by some of the excess electrons in the conduction band dropping back to the valence band and giving up their excess energy as radiation in the process. The wavelength of this emission corresponds, more or less, to the energy gap between valence and conduction bands. When semiconductor laser 10 is pumped strongly enough, a population inversion between certain of the valence and conduction levels is obtained and lasing action is produced at these wavelengths.

In a conventional semiconductor laser diode, the ends of chip material 14 would have been be cut by cleaving the semiconductor crystal so that die ends 30 and 32 would be smooth parallel surfaces which behave, at the crystal-air interface, like the mirrors in a conventional resonator. The semiconductor laser beam would be emitted through one or both die ends 30 and 32 at interface region 20.

In accordance with the present invention, the spatial distribution of the phase front of the emitted radiation is controlled to be roughly in the form of a section of an oblate ellipsoid so that oblate-spheroidal Gaussian modes are established in the semiconductor laser waveguide. In mathematical terms, an oblate ellipsoid may be defined as an ellipse that has been rotated about its minor axis. In this case, the minor axis is coincident with the optical axis, that is, the lateral direction of the diode.

Figure 2:
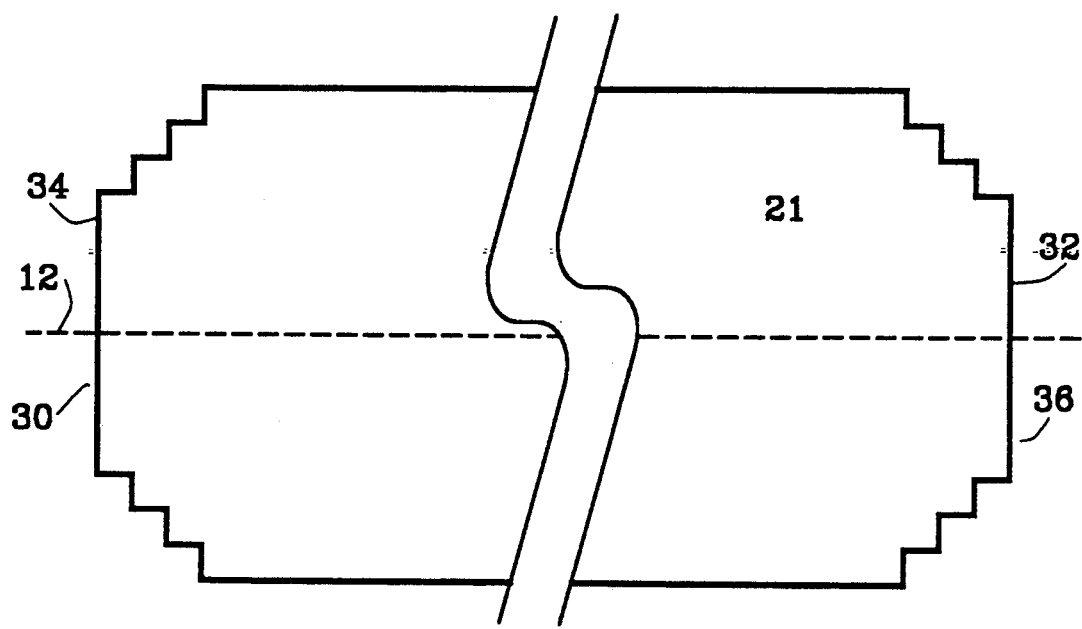
FIG. 2 is a partial cross sectional view of resonant cavity 21 shown in FIG. 1 taken along line AA in which the cavity ends are configured in the shape of a Fresnel lens equivalent to a section of an oblate ellipsoid as an example of one construction technique for semiconductor laser waveguides in which oblate-spheroidal Gaussian modes are established to enhance emitted laser beam characteristics.

One convenient technique for controlling the spatial distribution of the phase front of the emitted radiation to be roughly in the form of a section of an oblate ellipsoid is shown in FIG. 2 which is a partial cross section of resonant cavity 21 shown in FIG. 1 taken along line AA. Die ends 30 and 32 of chip material 14 have been formed into cavity ends 34 and 36 at the ends of resonant cavity 21. During lasing action, the laser beam generated by semiconductor laser 10 is emitted from one or both cavity ends 34 and 36.

Cavity ends 34 and 36 are each shaped as a Fresnel lens generally in an oblong shape which supports and reinforces phase fronts whose spatial distribution is in the form of a portion of an oblate ellipsoid. Such Fresnel lens equivalents may be constructed from stepped setbacks of higher bandgap material than the lasing region, from setbacks in the diffusion of zinc, or from the etching of the physical equivalent of a Fresnel lens into the end facet of the diode, at the air-semiconductor interface.

Other techniques for supporting and reinforcing the emitted beam phase fronts in this manner include controlled doping, changes in crystallization and non-absorbing mirrors, referred to as NAM's. These are regions near the facets that have a higher bandgap energy than the laser region. The current is confined to the lasing region; laser light is reflected but not absorbed at the NAM facet. Such non-absorbing mirrors can be fabricated by growing a layer of high-bandgap crystalline material at each end of the active optical cavity or by diffusing zinc everywhere except just before each mirror facet.

Laser beams emitted from resonant cavity 21 which have been configured to reinforce phase fronts whose spatial distribution is in the form of a portion of an oblate ellipsoid tend to be less astigmatic and anamorphic than laser beams from resonant cavities configured in conventional manners. Such laser beams do not exhibit orthogonally-oriented line foci, that is, astigmatism, and have a circular cross section in a plane transverse to the direction of beam travel. Such beams possess a much smaller divergence angle than beams from conventional semiconductor lasers. This results in a more highly directional and concentrated beam profile whose angular divergence is the same in all directions. When passed through focussing optics, such beams will produce waists typical of conventional optical lasers, rather than the line or point foci of conventional semiconductor lasers.

While this invention has been described with reference to its presently preferred embodiment, its scope is not limited thereto. Rather, such scope is only limited insofar as defined by the following set of claims and includes all equivalents thereof.

I claim as my invention:

1. The method of enhancing semiconductor laser diode beam characteristics, comprising the steps of:
   forming a resonant waveguide cavity in semiconductor material;
   establishing lasing in the semiconductor waveguide; and
   enhancing oblate-spheroidal lasing modes therein.

2. The method of claim 1 wherein the step of enhancing the oblate-spheroidal lasing modes further comprises:
   forming waveguide cavity ends which enhance oblate-spheroidal lasing modes in the cavity.

3. A semiconductor laser diode comprising:
   a resonant semiconductor laser waveguide cavity:
   means for establishing lasing in the waveguide cavity; and
   means for enhancing oblate-spheroidal lasing modes therein.

4. The semiconductor laser diode of claim 3, wherein the means for enhancing oblate-spheroidal lasing modes further comprises:
   cavity end means for enhancing oblate-spheroidal lasing modes.

5. The semiconductor laser diode of claim 4, wherein the cavity end means comprises:
   Fresnel lenses.

* * * * *